(12) United States Patent
Weissbach et al.

(10) Patent No.: US 8,026,583 B2
(45) Date of Patent: Sep. 27, 2011

(54) FLIP-CHIP MODULE AND METHOD FOR THE PRODUCTION THEREOF

(75) Inventors: Ernst-A. Weissbach, Baldham (DE); Juergen Ertl, Geretsried (DE)

(73) Assignee: HTC Beteiligungs GmbH, Baldham (DE)

( * ) Notice: Subject to any disclaimer, the term of this patent is extended or adjusted under 35 U.S.C. 154(b) by 330 days.

(21) Appl. No.: 12/065,830

(22) PCT Filed: Sep. 13, 2006
(Under 37 CFR 1.47)

(86) PCT No.: PCT/EP2006/008921
§ 371 (c)(1),
(2), (4) Date: Dec. 16, 2008

(87) PCT Pub. No.: WO2007/031298
PCT Pub. Date: Mar. 22, 2007

(65) Prior Publication Data
US 2011/0001232 A1    Jan. 6, 2011

(30) Foreign Application Priority Data

Sep. 14, 2005 (DE) .......................... 10 2005 043 910
Oct. 19, 2005 (DE) .......................... 10 2005 050 150

(51) Int. Cl.
*H01L 21/00* (2006.01)
(52) U.S. Cl. ........ 257/686; 257/692; 257/732; 257/766; 257/784; 257/E21.503; 257/E21.511; 257/E23.065; 257/E23.067; 257/E23.194; 257/E25.013; 438/108; 438/116

(58) Field of Classification Search .......... 257/686–784, 257/E21.503–E21.511, 23.021, 65–67, 92, 257/124, 194, 25.013, 29.022; 438/108–125
See application file for complete search history.

(56) References Cited

U.S. PATENT DOCUMENTS

| 4,647,959 A | 3/1987 | Smith |
| 4,878,611 A | 11/1989 | LoVasco et al. |

(Continued)

FOREIGN PATENT DOCUMENTS

GB    2062963 A    5/1981

OTHER PUBLICATIONS

International Search Report from International Application No. PCT/EP2006/008921, filed Sep. 13, 2006, mailed on Feb. 23, 2007.

(Continued)

*Primary Examiner* — Michael Lebentritt
(74) *Attorney, Agent, or Firm* — Houston Eliseeva, LLP

(57) ABSTRACT

The invention relates to a flip-chip module with a semiconductor chip with contact posts, wherein the contact posts are connected electrically and mechanically to a substrate. Provided between the substrate and the semiconductor chip is a spacer, which is coupled mechanically to the substrate and/or the semiconductor chip. By this means, thermal stresses in the flip-chip module are absorbed by the spacer and kept away from the semiconductor chip.

Figure 1A:
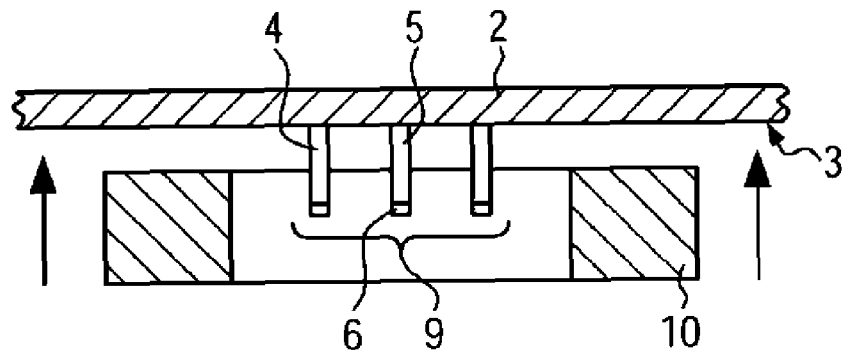

The invention also relates to a method for the production of a flip-chip module, in which firstly a spacer is located between the semiconductor chip and the substrate, after which the contact posts are soldered to the contact points of the substrate. Through the provision of the spacer the distance between the semiconductor chip and the substrate is set precisely, thereby improving the quality of the soldering points.

39 Claims, 3 Drawing Sheets

U.S. PATENT DOCUMENTS

| | | | |
|---|---|---|---|
| 5,219,117 A * | 6/1993 | Lin | 228/253 |
| 5,379,191 A * | 1/1995 | Carey et al. | 361/777 |
| 5,478,778 A * | 12/1995 | Tanisawa | 438/25 |
| 5,556,293 A * | 9/1996 | Pfaff | 439/266 |
| 5,684,677 A * | 11/1997 | Uchida et al. | 361/770 |
| 5,818,107 A * | 10/1998 | Pierson et al. | 257/723 |
| 5,834,848 A | 11/1998 | Iwasaki | |
| 5,872,051 A * | 2/1999 | Fallon et al. | 438/616 |
| 5,951,305 A * | 9/1999 | Haba | 439/70 |
| 6,046,910 A | 4/2000 | Ghaem et al. | |
| 6,140,144 A * | 10/2000 | Najafi et al. | 438/53 |
| 6,159,770 A * | 12/2000 | Tetaka et al. | 438/112 |
| 6,326,241 B1 | 12/2001 | Belke, Jr. et al. | |
| 6,329,711 B1 * | 12/2001 | Kawahara et al. | 257/698 |
| 6,376,915 B1 | 4/2002 | Hikita et al. | |
| 6,395,991 B1 | 5/2002 | Dockerty et al. | |
| 6,428,328 B2 * | 8/2002 | Haba et al. | 439/70 |
| 6,454,159 B1 * | 9/2002 | Takushima | 228/253 |
| 6,550,666 B2 | 4/2003 | Chew et al. | |
| 6,578,754 B1 | 6/2003 | Tung | |
| 6,592,019 B2 | 7/2003 | Tung | |
| 6,624,512 B2 * | 9/2003 | Kurusu | 257/737 |
| 6,649,444 B2 * | 11/2003 | Earnworth et al. | 438/108 |
| 6,677,677 B2 * | 1/2004 | Kimura et al. | 257/737 |
| 6,683,369 B2 | 1/2004 | Iwamoto | |
| 6,710,455 B2 * | 3/2004 | Goller et al. | 257/777 |
| 6,906,425 B2 * | 6/2005 | Stewart et al. | 257/778 |
| 6,917,525 B2 * | 7/2005 | Mok et al. | 361/767 |
| 6,959,489 B2 * | 11/2005 | Beroz et al. | 29/840 |
| 6,969,635 B2 * | 11/2005 | Patel et al. | 438/107 |
| 7,041,513 B2 | 5/2006 | Akram | |
| 7,161,237 B2 * | 1/2007 | Lee | 257/698 |
| 7,192,796 B2 * | 3/2007 | Zilber et al. | 438/26 |
| 7,247,508 B2 | 7/2007 | Higashitani et al. | |
| 7,253,516 B2 * | 8/2007 | Coenen | 257/724 |
| 7,311,531 B2 * | 12/2007 | Igarashi et al. | 439/91 |
| 7,667,323 B2 * | 2/2010 | Kierse et al. | 257/737 |
| 2002/0079577 A1 | 6/2002 | Ho | |
| 2002/0180029 A1 | 12/2002 | Higashitani et al. | |
| 2003/0017654 A1 | 1/2003 | Iwamoto | |
| 2003/0170921 A1 | 9/2003 | Akram | |
| 2003/0210531 A1 | 11/2003 | Alcoe et al. | |
| 2004/0130034 A1 | 7/2004 | Alvarez | |
| 2004/0189143 A1 * | 9/2004 | Hatakeyama et al. | 310/309 |
| 2004/0232561 A1 | 11/2004 | Odegard | |
| 2009/0224851 A1 * | 9/2009 | Feiertag et al. | 333/186 |

OTHER PUBLICATIONS

International Preliminary Report on Patentability from PCT/EP2006/008921, filed on Sep. 13, 2006, dated Apr. 8, 2008.

* cited by examiner

FLIP-CHIP MODULE AND METHOD FOR THE PRODUCTION THEREOF

This application is a 371 National Stage of PCT application serial number PCT/EP2006/008921, filed on Sep. 13, 2006, which claims priority to German Application No. DE 10 2005 043 910.1, filed on Sep. 14, 2005, and German Application No. DE 10 2005 050 150.8, filed on Oct. 19, 2005, all of which are incorporated herein by reference in their entirety.

The invention relates to a flip-chip module and a method of producing such a flip-chip module, wherein the flip-chip module comprises a semiconductor chip, which is provided on one face with contact posts, and a substrate with contact points soldered to the free ends of the contact posts.

Such a flip-chip module is known from U.S. Pat. No. 6,578,754 B1. The contact posts are comprised of one section containing substantially copper, and a shorter section made of the soldering material connected to the contact points of the substrate. The length of the copper section is at least 50 μm. These contact posts are intended for contacting contact points arranged in a regular grid with a grid spacing less than 100 μm and preferably in the range of 80 to 100 μm. Through the provision of defined contact posts, considerable benefits are obtained in comparison with conventional flip-chip modules. In particular, the danger of a short-circuit between adjacent contact points is much less than with conventional flip-chip modules in which the connection between the substrate and the semiconductor chip is made solely by spherical contact elements of soldering material. It is therefore possible for contact points to be contacted reliably in a grid of less than 100 μm.

Reference is also made to U.S. Pat. No. 6,550,666 B2 and U.S. Pat. No. 6,592,019 B2, in which further embodiments of the flip-chip module with contact posts described above are disclosed.

This flip-chip module also has all the advantages of conventional flip-chip modules in respect of wire bonding. In particular the path of the electrical circuit between the semiconductor chip and the substrate, and thus the signalling distance, is very short.

As already described in U.S. Pat. No. 6,578,754 B1 and U.S. Pat. No. 6,592,019 B2, considerable shear stresses may arise between the substrate and the semiconductor chip, which may even lead to distortions in the semiconductor chip and also in the substrate (see e.g. FIG. 4a of U.S. Pat. No. 6,578,754 B1.

Shear stresses within the flip-chip module are also explained in U.S. Pat. No. 6,592,019 B2. These shear stresses are caused by different thermal coefficients of expansion between the semiconductor chip and the substrate, since in soldering of the contact posts to the substrate, the entire module is placed in a soldering furnace and heated e.g. to around 230° C. At this temperature, the soldering material melts and bonds the contact posts to the relevant contact points of the substrate. The temperature is then reduced, with the soldering material setting at around 200° C. With further lowering of the temperature to room temperature, the substrate shrinks more than the semiconductor chip, leading to distortions in the flip-chip module.

As a result, in the case of such flip-chip modules with a multiplicity of contact posts, owing to the stresses within the flip-chip module, the soldered connections between the contact posts and the substrate may break up or contact posts may break loose from the semiconductor chip, or the semiconductor chip may even be damaged. It is therefore not possible to provide large semiconductor chips, e.g. DRAM chips, in such a flip-chip module.

There is however a considerable demand for contacting DRAM chips directly by means of a flip-chip module, without the roundabout route of an additional wiring level, since on the one hand due to the multiplicity of connections conventional contacting by wires is scarcely possible any longer, while on the other hand the desired data transfer rates are not possible with conventional wire bonding.

The contact points of these DRAM chips are arranged with a grid spacing of less than 100 μm, which is described in the specialist jargon as "fine pitch". Such fine pitch can be contacted by the contact posts explained above, but conventional contacting methods for flip-chip modules are not suitable for this purpose. It should also be taken into account that for conductor paths within the chip, materials with low dielectricity (low-k passivation materials) are increasingly used. Such materials are mechanically weak, for which reason mechanical stress exerted on such a semiconductor chip leads to cracks and fractures in the passivation layer. Current semiconductor chips are therefore very sensitive to stress, which makes more difficult their use in connection with the flip-chip module described above.

DE 697 148 T2 shows a connection between a substrate of a flip-chip module and a circuit board, which is in the form of posts of soldering material. The resilience of the soldering material posts compensates for the considerably different thermal coefficients of expansion of the substrate and the circuit board. By using corner contact pins it is possible to increase the contact pressure. The contact pins are made of Kovar and are fixed to the circuit board by brazing.

Described in U.S. Pat. No. 6,376,915 B1 is a flip-chip module which has a circuit board and a semiconductor chip connected by means of so-called bumps, which both set the distance between the semiconductor chip and the circuit board, and also make an appropriate connection in each case. In the peripheral zone between the circuit board and the semiconductor chip is a continuous wall section made of the same material as the bumps. This wall section is moulded on at the same time as the bumps.

EP 0 930 645 A2 discloses a flip-chip module in which a chip is electrically connected to a circuit board by means of bumps made of metal. The physical connection is made by an adhesive bond of non-conductive adhesive, with which the area between the chip and the circuit board is filled. This adhesive material has a thermal coefficient of expansion which lies between the thermal coefficients of expansion of the chip and the circuit board made of plastic or its plastic holder.

US 2002/0079577 A1 discloses a flip-chip module with a circuit board and a chip, wherein both the chip and the circuit board are provided with soldered connections. The soldered connections in the peripheral area are made of a soldering material with a higher melting temperature, so that only the soldered connections in the inner area melt during the soldering process, and the soldered connections in the peripheral area serve as spacers.

US 2004/0232561 A1 discloses a flip-chip module in which spacer elements are provided between the chip and the substrate, to ensure adequate height between the chip and the substrate. The spacer elements are so designed that they increase the distance between the chip and the substrate during the soldering process. The electrical connections between the substrate and the chip are formed entirely of soldering material. The intermediate space between the substrate and the chip may be filled out with filler material. This is intended to reduce concentrations of stress at the soldered connections.

Similar flip-chip modules are disclosed in GB 2 062 963 A and U.S. Pat. No. 4,878,611.

US 2003/0210531 A1 describes a flip-chip module with a chip and a substrate which are connected by electrically conductive elements, with scope for the insertion of elastic elements in the centre of these electrical connecting elements. Around the chip is a collar, with a gap between the collar and the chip, so that the collar and the chip are not in contact. The collar has a thermal coefficient of expansion and an elasticity similar to those of the chip.

U.S. Pat. No. 6,046,910 describes a flip-chip module in which a compressible preform of polymer material is fitted between a semiconductor chip and a substrate.

Other flip-chip modules are disclosed by U.S. Pat. No. 4,647,959 and U.S. Pat. No. 5,834,848.

The invention is based on the problem of so developing a flip-chip module with the contact posts described above that fewer faults are caused by the strains within the flip-chip module. The invention is also based on the problem of creating a method for the production of such a flip-chip module.

The problem is solved by a flip-chip model with the features:
  a semiconductor chip (2) having on one face (3) contact posts (4) arranged roughly at right-angles to this face (3),
  a substrate (8) with contact points (7), each connected to a free end of one of the contact posts (4), wherein the substrate (8) has a different thermal coefficient of expansion to that of the semiconductor chip (2), and
  a rigid spacer (10), located between the substrate (8) and the semiconductor chip (2), and with a thermal coefficient of expansion varying less from the thermal coefficient of expansion of the semiconductor chip (2) than from the thermal coefficient of expansion of the substrate, wherein the spacer (10) is connected either to the substrate (8) and/or to the semiconductor chip (2) at least at several points distributed over its contact faces;
and by a method with the features:
  a semiconductor chip (2) having on one face (3) contact posts (4) arranged roughly at right-angles to this face (3), with each of the contact posts having a soldered section with solder material and a post, forming an elongated section made of an electrically conductive material which does not melt at the melting temperature of the soldering material,
  a substrate (8) with contact points (7), each to be soldered to a free end of one of the contact posts (4),
  wherein firstly a spacer (10) is arranged between the semiconductor chip (2) and the substrate (8), and then the contact posts (4) are soldered to the contact points (7) of the substrate.

Since the spacer is connected to the substrate and/or the semiconductor chip, and the thermal coefficient of expansion of the spacer is closer to the thermal coefficient of expansion of the semiconductor chip than to the thermal coefficient of expansion of the substrate, then either the strains occur mainly between the substrate and the spacer, and not between the substrate and the semiconductor chip, or else the semiconductor chip is so strengthened by the connection to the spacer that it can resist the strains which occur. The spacer thus absorbs the strain of the substrate caused by the differing thermal coefficient of expansion. The spacer, which has no electrical functional elements whatsoever, is of stable design, so that this strain is not transmitted to the sensitive semiconductor chip.

The connection at several points distributed over the contact surfaces may also be realised through a large surface connection, e.g. a soldered connection or an adhesive bond, with the continuous connecting layer extending over the several distributed points.

The substrate, which is usually made of a plastic or ceramic material provided with copper conductor paths, is stable enough to absorb these mechanical stresses continuously. With a connection between the substrate and the spacer, the unit comprising the substrate and the spacer is considerably more rigid than the substrate alone, so that the strains produce no bends in the substrate or considerably less than with the flip-chip technology used to date. Also the mechanical loading of the soldering points between the contact posts and the substrate is significantly lower than with the flip-chip modules known to date.

Through the provision of the rigid spacers, the risk of damage to the soldering points between the contact posts and the substrate, and the risk of damage to the semiconductor chip, are significantly reduced.

Preferably the spacer is connected both to the substrate and to the semiconductor chip at least at several points distributed over their contact surfaces. Due to the physical connection between the semiconductor chip and the spacer, each having a similar thermal coefficient of expansion, the semiconductor chip holds its shape even during temperature variations occurring in the soldering process, and possible stresses are inhibited.

The differences between the thermal coefficient of expansion of the spacer and the thermal coefficient of expansion of the semiconductor chip are preferably less than 40%, and in particular less than 20% or 10% of the difference between the thermal coefficient of expansion of the semiconductor chip and the thermal coefficient of expansion of the substrate. The greater the agreement between the thermal coefficients of expansion of the semiconductor chip and the spacer, the lower are the forces acting on the semiconductor chip as a result of thermal stress.

In the method according to the invention for the production of a flip-chip module, a spacer is first of all placed between the semiconductor chip and the substrate, after which the contact posts are soldered to the contact points of the substrate.

In this way the distance between the substrate and the semiconductor chip is set precisely. This distance should correspond to the average height of all contact posts including their soldering points.

The inventors of the present invention have established that, in the method known to date, the problem is that the distance between the substrate and the semiconductor chip is either too short or too long. If the distance is too short, then the soldering material is pressed out from the space between the contact post and the corresponding contact point of the substrate, so that only a very thin connecting layer of soldering material remains between the contact post and the contact point. This thin connecting layer is however mechanically weak, so that it can break quickly under strain.

If the distance between the semiconductor chip and the substrate is too large, then there is a correspondingly large gap between the contact post and the contact point of the substrate. The soldering material is stretched over this gap, leading to reductions at the soldering point. Such reductions are again mechanically weak, and tend to break up under stress loading. This means that mechanically weak soldering points are created between the semiconductor chip and the substrate, both when distances are too large and also when they are too small. These weak points tend to break up under thermal stresses in the flip-chip module.

Through the method according to the invention, the distance between the semiconductor chip and the substrate is maintained very precisely, thus considerably lowering the risk of creating physically weak soldering points. A flip-chip module produced by the method according to the invention is therefore better able to absorb thermal stresses, and the risk of damage to the flip-chip module is considerably reduced.

The flip-chip module according to the invention described above is preferably produced by the method according to the invention, with the spacer coupled to the substrate.

The invention is explained in detail below with the aid of the drawings, which show in.

Figure 1B:
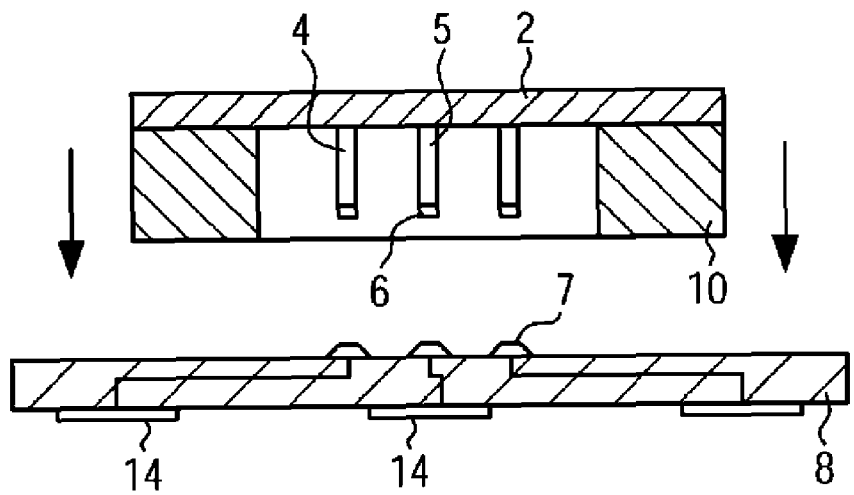
Figure 1C:
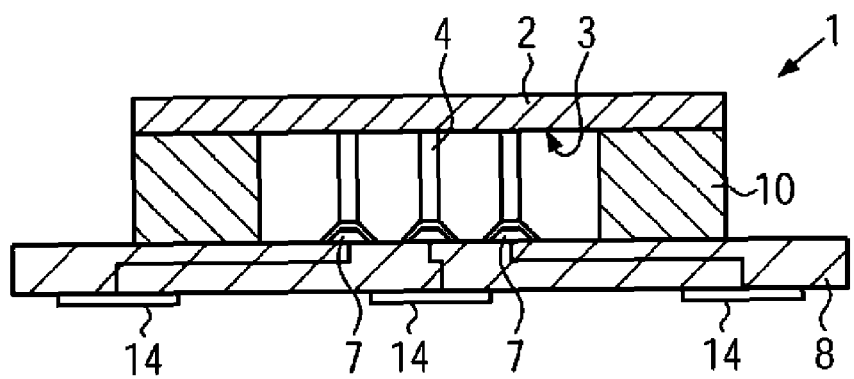

FIGS. 1a to 1c the stages of assembling a flip-chip module according to the invention, in a schematic cross-sectional view FIGS. 2a to 2c in each case a section through a flip-chip module according to the invention in the area of a soldering point, wherein during the soldering process different distances have been maintained between the respective substrate and the semiconductor chip FIGS. 3a and 3b in each case a schematic view from below of a semiconductor chip with contact posts and a spacer FIG. 4a a plan view of a flip-chip module according to the invention FIG. 4b the flip-chip module of FIG. 4a in a sectional view along line A-A FIGS. 5a and 5b in each case a section through a flip-chip module according to the invention in the area of a soldering point.

A flip-chip module 1 according to the invention (FIG. 1c) comprises a semiconductor chip 2 with I/O contact points on one side face 3. Provided at the I/O contact points are contact posts 4, each standing upright on the side face 3.

These contact posts are produced in accordance with a method as described in U.S. Pat. No. 6,578,754 B1, U.S. Pat. No. 6,550,666 B2 and U.S. Pat. No. 6,592,019 B2 respectively. Reference is therefore made to the contents of these patents in full, and they are incorporated in the present application.

The contact posts 4 are made of two sections, namely a metal post 5 and a solder section 6 (FIG. 1a). The metal post 5 is made usually of copper and/or gold, is fitted directly on the semiconductor chip 2, and is in electrical contact with a conductor path of the semiconductor chip 2. The solder sections 6 are located at the ends of the contact posts 4 furthest away from the semiconductor chip 2, and provide mechanical and electrical connection with contact points 7 of a substrate 8. So long as the contact posts 4 are not soldered to the contact points 7 of the substrate 8, the solder sections 6 form free ends of the contact posts 4 (FIG. 1a, FIG. 1b).

The contact posts of the present invention thus comprise an elongated column of an electrically conductive material and a solder section, wherein the column is made of a material which does not melt at the melting temperature of the solder of the solder section. The length of the column is at least 20 μm, preferably at least 50 μm, 100 μm or 200 μm.

The soldering material of the solder sections 6 is for example a tin-lead alloy, or it may also be a lead-free soldering material.

The embodiment shown in FIGS. 1a to 1c has a contact area 9 in which the contact posts 4 are located and which is formed in the centre of the semiconductor chip 2. In FIGS. 1a to 1c three contact posts are shown to simplify the illustration. Typically, semiconductor chips of a flip-chip module according to the invention have between 40 and 200 contact posts. It has been found that, with the flip-chip module according to the invention, semiconductor chips may have more than 100 or more than 200 or more than 500 up to several 1000 directly contactable contact posts on a substrate. The centre-to-centre distance between two adjacent contact posts 4 is typically 20 μm to 200 μm. The contact posts may be arranged in one or more rows along a line running in the centre of the chip (=centre pinning) or in one or more rows along the edges of the semiconductor chip.

In the method shown in FIGS. 1a to 1c for producing a flip-chip module according to the invention, in a first step (FIG. 1a) a spacer 10 is fitted next to the contact posts 4, aligned relative to the contact posts 4 and connected to the side face 3 of the semiconductor chip 2. The connection between the spacer 10 and the semiconductor chip 2 is made by adhesive bonding, with the spacer 10 being bonded to the semiconductor chip 2 as far as possible over its entire contact surface. Instead of an adhesive bond, a soldered connection may also be provided. It is not necessary to make the connection over the whole surface. It may also be expedient to connect the spacer 10 to the semiconductor chip 2 at individual points distributed over the contact surfaces. It is however expedient to provide the connection, whether made flat or via several connection points, over a contact surface which is at least 10% of the area of the semiconductor chip 2, and preferably at least 20%, 30%, 50%, 70%, 80% or 90% of the area of the semiconductor chip.

When the spacer 10 is connected to the semiconductor chip 2, the latter is still part of a wafer. After the spacer 10 has been connected to the wafer and semiconductor chip 2 respectively, the semiconductor chip is cut out of the wafer by a conventional cutting process (not shown). The unit thus obtained, comprising the semiconductor chip 2 and the spacer 10, is arranged on the substrate 8 (FIG. 1b) with the free ends of the contact posts 4 or the solder sections 6 on the contact points 7 of the substrate.

The contact points 7 are pretreated copper contacts capable of being soldered. The substrate 8 with the spacer element 10 and semiconductor chip 2 placed on top is put into a soldering furnace or a thermal compression facility, in which the whole unit is heated over a temperature profile to a soldering temperature of e.g. 230° C. By this means the soldering material of the solder sections 6 is melted, wetting both the lower ends of the metal posts 5 of the semiconductor chip 2 and also the contact points 7 of the substrate 8. On cooling down the soldering material hardens, thereby providing permanent electrical and mechanical connection of the contact posts 4 of the semiconductor chip 2 with the contact points 7 of the substrate 8 (FIG. 1c).

Preferably, at the same time as the soldering, the spacer 10 is also connected physically to the substrate 8 by means of an adhesive bond or a soldered connection. It is however also possible for the connection between the spacer 10 and the substrate 8 to be made before soldering. The connection between the spacer 10 and the substrate 8 is expediently made over the whole area of the contact surfaces of the spacer 10 with the substrate 8.

Due to the provision of the spacer 10 between the substrate 8 and the semiconductor chip 2, a predetermined distance between the substrate 8 and the semiconductor chip 2 is maintained during the soldering process. The height and thickness respectively of the spacer is determined by means of a measurement of the height of the metal posts after the production process. The provision of the spacer improves the quality of the soldered connection significantly, as explained below with the aid of FIGS. 2a to 2c, each of which shows a flip-chip module in the area of a contact post.

Figure 2A:
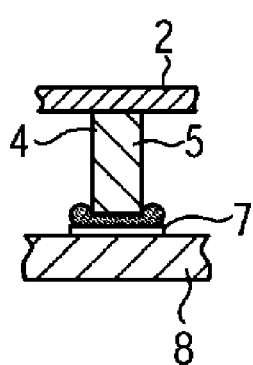

In FIG. 2a the distance between the semiconductor chip 2 and the substrate 8 during the soldering process was too small. Because of this, a significant portion of the soldering material was pressed out of the area between the contact points 7 and the metal post 5. The metal post 5 acts like a punch, pressing the soldering material to the side. As a result, only a thin layer of soldering material remains between the contact point 7 and the metal post 5. This thin layer is mechanically weak and may easily break up under the stresses described at the start. There is also the risk of soldering material escaping beyond the contact point 7 and coming into contact with an adjacent copper track, leading to a short-circuit.

If on the other hand the distance between the semiconductor chip 2 and the substrate 8 is too large (FIG. 2c), then there is a correspondingly large gap between the metal post 5 and the contact point 7 of the substrate 8. The soldering material is stretched over this gap, leading to a reduction 11. This reduction is again mechanically weak, tending to break up under a mechanical load. An alloy forms between the soldering material and the copper of the contact post and the substrate respectively. This alloy is to begin with a good electrical conductor and, immediately after production of the flip-chip module it is not possible to determine by electrical tests that such an alloy is present here. However elements of the alloy, on application of an electrical current may separate preferably in the area of the reduction, so that the cross-section of the conductor path is further reduced or the electrical connections may even be broken. The material will also become brittle over time (Kirkendale voids).

Figure 2B:
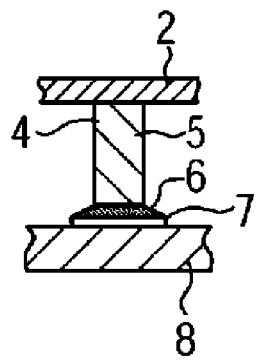
Figure 2C:
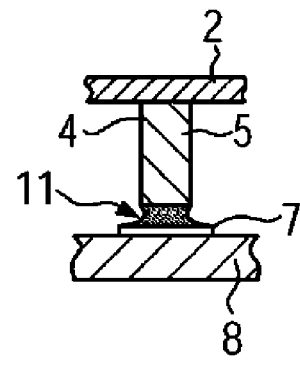

If the distance between the semiconductor chip 2 and the substrate 8 is set correctly, a mechanically stable soldered connection is made between the contact post 4 and the contact point 7 of the substrate 8 (FIG. 2b). Soldered connections of the desired quality are therefore obtained through the provision of the spacer 10 according to the invention between the substrate 8 and the semiconductor chip 2. For this purpose it is not necessary for the spacer 10 to be connected physically to the substrate and/or the semiconductor chip 2, but such a physical connection is preferred, as explained in detail below.

The spacer 10 is made of a rigid material, e.g. fibre-reinforced plastic or a coated steel alloy (Invar®) with a low thermal coefficient of expansion. Suitable reinforcing fibres for the fibre-reinforced plastic are carbon fibres and aramid fibres (Kevlar®). The spacer may also be made of a semiconductor material such as e.g. silicon.

The material of the spacer has a thermal coefficient of expansion which differs less from the thermal coefficient of expansion of the semiconductor chip than from the thermal coefficient of expansion of the substrate. I.e. the thermal expansion of the spacer 10 corresponds more to the semiconductor chip 2 than to the substrate 8.

If the spacer 10 is physically coupled to the substrate 8, then the thermal stresses between the substrate and the spacer 10 will be absorbed by the spacer 10 and not transmitted to the semiconductor chip 2. The spacer 10 has no electrical functional elements and is made of a rigid material, so that the thermal stresses lead to no or at any rate minimal distortions. The substrate 8 is usually made of a plastic or ceramic material provided with copper conductor paths 12, and is so stable that it can absorb these mechanical stresses continuously. Although thermal stresses continue to exist between the substrate and the spacer, they do not impair the continuous operation of the flip-chip module according to the invention.

The unit comprised of the substrate 8 and the spacer 10 also forms such a rigid body that no or at any rate only negligible bends are able to occur in the substrate.

So that the spacer 10 can absorb the thermal stresses generated, it is coupled physically to the substrate 8. This coupling is effected preferably by a flat adhesive bond. In principle, however, it is sufficient for the spacer 10 and the substrate 8 to be connected to one another at several points distributed over their contact surfaces.

It is also possible for the spacer 10 to be coupled physically to the semiconductor chip 2, with no physical connection between the substrate and the spacer. Such a design of the flip-chip module according to the invention is expedient if it is required that the semiconductor chip 2 should be removable from the substrate 8 for repair work. In this case the semiconductor chip 2 and the spacer form a rigid unit, which is much better able to withstand mechanical loads.

Since nowadays, outside the connection zone of the contact posts 5, semiconductor chips are generally coated with a so-called low-k material, which has low strength, it is expedient to make the connection at the contact surface between the spacer and the semiconductor chip over an area corresponding to at least 30%, 50%, 70%, 80%, 90% or 95% of the area of the semiconductor chip. Through a connection of the spacer to the semiconductor chip over a wide area, high strength of this unit is ensured. A low-k material of this kind is described for example in the INTERNATIONAL TECHNOLOGY ROADMAP FOR SEMICONDUCTORS—INTERCONNECT, 2005 edition, on pages 19 and 20.

Preferably the spacer 10 and the semiconductor chip 2 are also connected to one another, at least at several points distributed over their contact surfaces. Through the physical connection between the semiconductor chip 2 and the spacer 10, each of which have a similar thermal coefficient of expansion, the semiconductor chip 2 holds its shape even during the temperature variations occurring in the course of the soldering process, and possible cracking is inhibited.

The difference between the thermal coefficient of expansion of the spacer and the thermal coefficient of expansion of the semiconductor chip is preferably less than 40% and in particular less than 20% or 10% or 5% of the difference between the thermal coefficient of expansion of the semiconductor chip 2 and the thermal coefficient of expansion of the substrate 8. The closer the agreement between the thermal coefficient of expansion of the semiconductor chip 2 and that of the spacer 10, the lower the forces acting on the semiconductor chip 2 due to thermal stresses.

This results in typical thermal coefficients of expansion for the spacer which are 10 to 100 times less than those of the substrate, which is for example an epoxy-glass fibre circuit board.

With the spacer 10 according to the invention, which is at least physically coupled to the substrate 8, bends in the flip-chip module according to the invention such as occur in known flip-chip modules are reduced or even completely avoided. As a result, the risk of damage to the soldered connections between the contact posts 4 and the substrate 8, or of damage to the semiconductor chip 2 is considerably reduced. By this means it is possible to connect electrically and mechanically to a substrate by means of contact posts even semiconductor chips which are sensitive to mechanical stresses, such as e.g. the latest generation of DRAM chips. The flip-chip module according to the invention is suitable for semiconductor chips with up to a thousand contact posts.

Figure 3A:
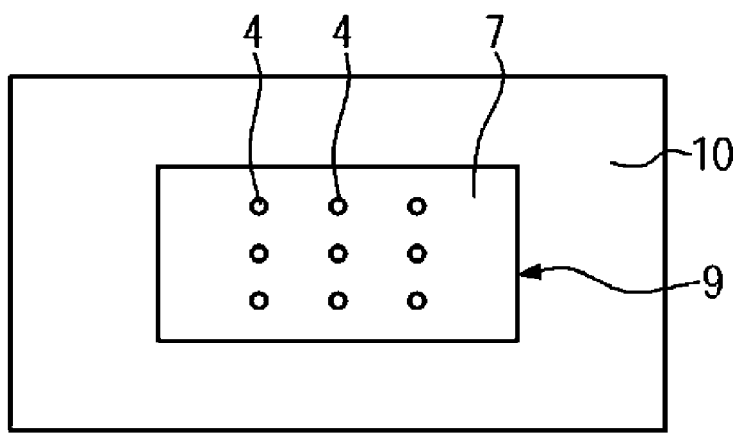
Figure 3B:
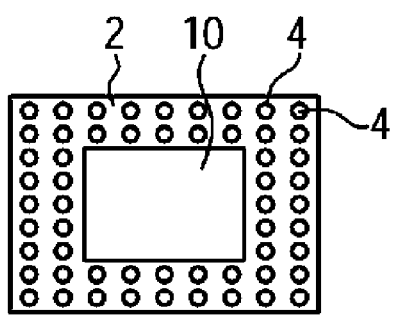

The semiconductor chip 2 shown in FIGS. 1a and 1b is illustrated in FIG. 3a in a view from below together with the spacer 10. It can be seen that this spacer forms a frame around the contact area 9 in which the contact posts 4 are arranged. This frame is in one piece.

Within the scope of the invention it is also possible to make the spacer 10 of several separate parts, provided on the semiconductor chip 2 with clearance from or also adjacent to one another. FIG. 3b shows an alternative embodiment in which the contact posts 4 are arranged around the edge of the semiconductor chip 2 and a rectangular spacer 10 is provided in the centre.

Figure 4A:
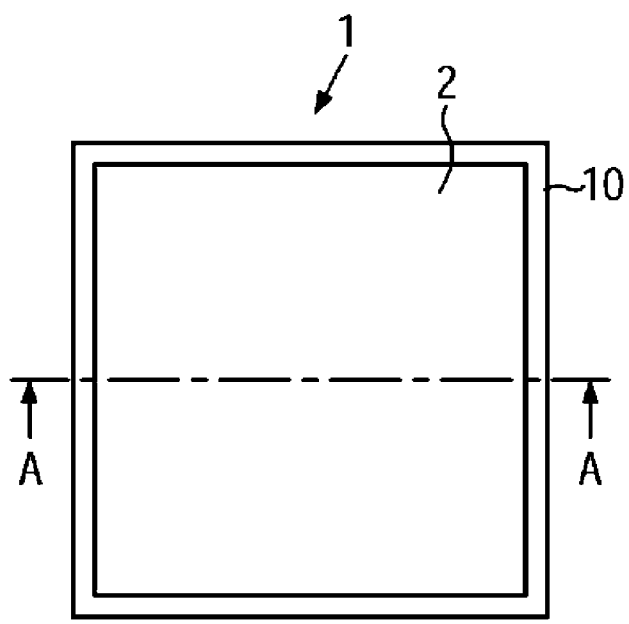
Figure 4B:
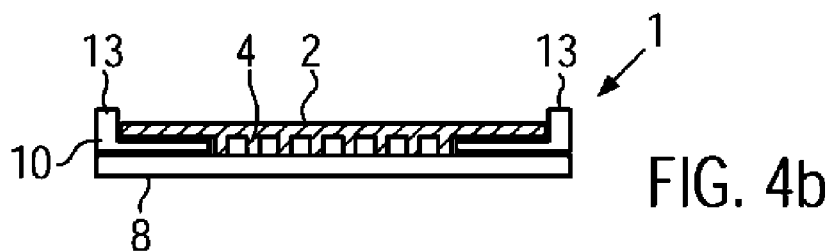

FIG. 4a shows a further embodiment of a flip-chip module 1 according to the invention in a view from above. FIG. 4b shows a section along the line A-A of FIG. 4a. This flip-chip module 1 again has a semiconductor chip 2, a spacer 10, a substrate 8 and contact posts 4 which are mechanically and electrically connected to the appropriate contact points of the substrate 8. This flip-chip module is distinguished by the fact that the spacer 10 protrudes to the side of the semiconductor chip 2 and has a continuous projection 13 oriented upwards, which then encompasses the side edges of the semiconductor chip 2. Preferably, the projection 13 protrudes slightly at the surface of the semiconductor chip, so that the spacer 10 forms a basin in which the semiconductor chip 2 may be cast with a synthetic resin. By this means, the semiconductor chip 2 is protected by the spacer 10 at the side. Within the scope of the invention it is also possible to provide a cover, which is either bonded directly on to the semiconductor chip 2, or connected physically to the spacer 10 protruding from the side of the semiconductor chip 2.

In a further variant of the invention, the spacer may also protrude from the side of the semiconductor chip, without the spacer being formed with an upwards-oriented projection.

Figure 5A:
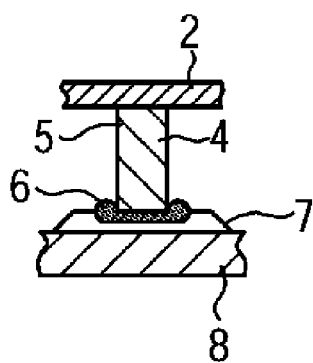

FIG. 5a shows a section through a flip-chip module according to the invention in the area of a soldering point, with a detail of the semiconductor chip 2, a contact post 4, a contact point 7 and a detail of the substrate 8.

The contact point 7 is provided with a recess 15 to accommodate the lower end of the contact post 4. Viewed from above, the recess is a flat circular basin, with a diameter somewhat greater than the diameter of the contact post 4.

Before the soldering process, the contact posts 4 of a semiconductor chip 2 are placed in the recesses 15 of the contact points 7 of a substrate 8. This prevents the semiconductor chip 2 from slipping on the substrate 8. It is therefore unnecessary, as was the case with conventional methods, to join the semiconductor chip 2 and the substrate 8 temporarily with a large drop of adhesive before soldering. Formerly this drop of adhesive had to extend from the bottom of the semiconductor chip 2 to the top of the substrate 8 and, due to the use of contact posts 4, had a considerable extent. Moreover the recesses 15 of the contact points 7 simplify the alignment of all contact posts 4 relative to the contact points 7 since, when all lower end sections of the contact posts 4 are located in the relevant recesses 15, then the contact posts 4 are clearly aligned on the relevant contact point 7.

During soldering, the material of the solder section 6 flows into the recess 15 of the respective contact point 7. Through the provision of the recess 15, the area in which the material of the solder section 6 is distributed is limited, thus avoiding the risk of fault contacts due to soldering material connecting two contact points 7 with one another.

In the embodiment according to FIG. 5a, the recess 15 is formed only in the material of the contact point 7. According to a further embodiment (FIG. 5b), the recess 15 may extend into the substrate 8. The recess extending into the substrate 8 is coated by the contact point 7 and forms a deep recess into which a part of the metal post 5 also extends. The bottom end section of the metal post 5 is encompassed by the material of the solder section 6, creating on the one hand the electrical connection to the contact point 7 and also a robust mechanical connection. Because of the large connecting surface and the three-dimensional support of the metal post 5, a soldered connection of high mechanical strength is obtained between the substrate 8 and the semiconductor chip 2.

Figure 5B:
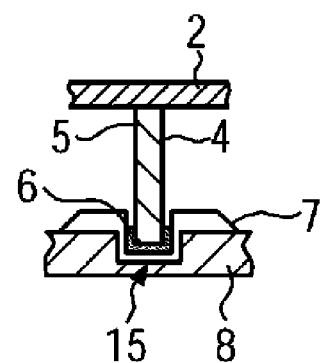

In the embodiments of FIGS. 5a and 5b, the length of the contact posts 4 relative to the height of the spacer 10 is chosen so that an ideal soldered connection results, i.e. in the embodiment according to FIG. 5a the length of the contact post 4 surrounding the metal post 5 and the solder section 6 does not exceed the height of the spacer 10, while on the other hand in the embodiment according to FIG. 5b the length of the contact post 4 is somewhat greater than the height of the spacer 10.

The flip-chip module according to the invention explained above may be placed on a circuit board as a unit, with the contact points on the circuit board being electrically connected. When the flip-chip module is used in this way, the substrates 8 are described as "chip carriers", having on the surface facing towards the semiconductor chip 2 a grid of contact points 7 in fine pitch and, on the side opposite the semiconductor chip 2, contact points 14 in a coarser grid. Each contact point 14 is connected electrically to a contact point 7. The contact points 14 may be connected electrically and mechanically by conventional soldering methods to contact points provided in a corresponding grid on a circuit board. Here the substrate 8 serves as a kind of transmission from a contact point grid in fine pitch to a much coarser contact point grid.

The flip-chip modules according to the invention may also comprise several semiconductor chips, all mounted on a common substrate.

The flip-chip modules according to the invention are especially suitable for the production of SIMM modules (Single Inline Memory Modules) and/or DIMM modules (Dual Inline Memory Modules). Such a flip-chip module is provided on the substrate with an edge connector by means of which, through insertion in a corresponding mating edge connector on a circuit board in a computer, it may be contacted by the latter.

The invention may be summarised briefly as follows:

The invention relates to a flip-chip module with a semiconductor chip with contact posts, wherein the contact posts are connected electrically and mechanically to a substrate. Provided between the substrate and the semiconductor chip is a spacer, which is coupled mechanically at least to the substrate. By this means, thermal stresses in the flip-chip module are absorbed by the spacer and kept away from the semiconductor chip.

The invention also relates to a method for the production of a flip-chip module, in which firstly a spacer is located between the semiconductor chip and the substrate, after which the contact posts are soldered to the contact points of the substrate. Through the provision of the spacer the distance between the semiconductor chip and the substrate is set precisely, thereby improving the quality of the soldering points.

LIST OF REFERENCE NUMBERS 1 flip-chip module
2 semiconductor chip
3 side face
4 contact posts
5 metal post
6 solder section
7 contact point
8 substrate
9 contact area
10 spacer
11 reduction
12 copper conductor path
13 projection
14 contact point
15 recess

The invention claimed is:

1. Flip-chip module comprising:
a semiconductor chip having on one face contact posts projecting from this face,
a substrate with contact points, each connected with solder to a free end of one of the contact posts, wherein the substrate has a different thermal coefficient of expansion to that of the semiconductor chip, and
a rigid spacer, located between the substrate and the semiconductor chip, and with a thermal coefficient of expansion varying less from the thermal coefficient of expansion of the semiconductor chip than from the thermal coefficient of expansion of the substrate, wherein the spacer is connected either to the substrate and/or to the semiconductor chip at least at several points distributed over its contact faces.

2. Flip-chip module according to claim 1, wherein a size of the contact face at which the spacer is connected to the substrate or the semiconductor chip corresponds to at least 10% to 20% of the size of the semiconductor chip.

3. Flip-chip module according to claim 2, wherein the spacer and the substrate and/or the semiconductor chip are connected by a flat connection which extends over at least 10% of the area of the semiconductor chip.

4. Flip-chip module according to claim 1, wherein the spacer and the substrate and/or the semiconductor chip are connected by a flat connection which extends over at least 10% of the area of the semiconductor chip.

5. Flip-chip module according to claim 3, wherein the flat connection extends over at least 20% of the area of the semiconductor chip.

6. Flip-chip module according to claim 1, wherein the spacer is connected both to the substrate and to the semiconductor chip.

7. Flip-chip module according to claim 1, wherein a contact area in which the contact posts are located is placed in a center region of the semiconductor chip, and the spacer surrounds the contact area.

8. Flip-chip module according to claim 1, wherein a contact area in which the contact posts are located is made continuous around the edge area of the semiconductor chip, and the spacer is located within the contact area.

9. Flip-chip module according to claim 1, wherein the difference between the thermal coefficient of expansion of the spacer and the thermal coefficient of expansion of the semiconductor chip is less than 40% of the difference between the thermal coefficient of expansion of the semiconductor chip and the thermal coefficient of expansion of the substrate.

10. Flip-chip module according to claim 1, wherein the spacer is made of fiber-reinforced plastic, semiconductor material, or a coated steel alloy with a low thermal coefficient of expansion.

11. Flip-chip module according to claim 1, wherein the thickness of the spacer corresponds to the average height of the contact post and the relevant soldered connection.

12. Flip-chip module according to claim 1, wherein the contact posts are arranged in a regular grid and the clearance between adjacent contact posts is less than or equal to 100 μm.

13. Flip-chip module according to claim 1, wherein the number of contact posts of the semiconductor chip is at least 50.

14. Flip-chip module according to claim 1, wherein the contact posts are each made of a metal post and a soldered section, with the metal post mounted directly on the semiconductor chip and the soldered section formed on the end of the metal post which is furthest away from the semiconductor chip.

15. Flip-chip module according to claim 14, wherein the metal post is made substantially of copper and/or gold.

16. Flip-chip module according to claim 1, wherein the substrate is made of a plastic or ceramic material, on which conductor paths are provided.

17. Flip-chip module according to claim 1, wherein the flip-chip module comprises several semiconductor chips.

18. Flip-chip module according to claim 1, wherein the contact points each have a recess to accommodate the bottom end section of one of the contact posts.

19. Method of producing a flip-chip module comprising:
for a semiconductor chip having on one face contact posts projecting from this face, with each of the contact posts having a soldered section with solder material and a post, forming an elongated section made of an electrically conductive material which does not melt at the melting temperature of the soldering material,
for a substrate with contact points, each being soldered to a free end of one of the contact posts, wherein firstly a spacer is arranged between the semiconductor chip and the substrate, soldering the contact posts to the contact points of the substrate.

20. Method according to claim 19, wherein firstly the spacer is connected to the semiconductor chip and the unit comprising the semiconductor chip and the spacer is then arranged on the substrate for soldering the contact posts to the contact points of the substrate.

21. Method according to claim 19, wherein the connection between the semiconductor chip and the spacer is made by soldering or bonding.

22. Method according to claim 21, wherein at the same time as the contact posts are soldered to the contact points of the substrate, the spacer is connected to the substrate.

23. Method according to claim 19, wherein the connection between the substrate and the spacer is made by soldering or bonding.

24. Method of producing a flip-chip module, the method comprising:
providing a semiconductor chip having on one face contact posts projecting from this face,
providing a substrate with contact points, each connected with solder to a free end of one of the contact posts, wherein the substrate has a different thermal coefficient of expansion to that of the semiconductor chip, and
positioning a rigid spacer between the substrate and the semiconductor chip, the rigid spacer having a thermal coefficient of expansion varying less from the thermal coefficient of expansion of the semiconductor chip than from the thermal coefficient of expansion of the substrate, wherein the spacer is connected either to the substrate and/or to the semiconductor chip at least at several points distributed over its contact faces.

25. Flip-chip module according to claim 5, wherein the spacer is connected both to the substrate and to the semiconductor chip.

26. Flip-chip module according to claim 25, wherein a contact area in which the contact posts are located is placed at a center region of the semiconductor chip, and the spacer surrounds the contact area.

27. Flip-chip module according to claim 26, wherein the spacer protrudes at the edges of the semiconductor chip.

28. Flip-chip module according to claim 27, wherein the spacer has a projection that surrounds the edges of the semiconductor chip.

29. Flip-chip module according to claim 28, wherein a contact area in which the contact posts are located is made continuous around the edge area of the semiconductor chip, and the spacer is located within the contact area.

30. Flip-chip module according to claim 29, wherein the difference between the thermal coefficient of expansion of the spacer and the thermal coefficient of expansion of the semiconductor chip is less than 40% of the difference between the thermal coefficient of expansion of the semiconductor chip and the thermal coefficient of expansion of the substrate.

31. Flip-chip module according to claim 30, wherein the spacer is made of fiber-reinforced plastic, semiconductor material, or a coated steel alloy with a low thermal coefficient of expansion.

32. Flip-chip module according to claim 31, wherein the thickness of the spacer corresponds to the average height of the contact post and the relevant soldered connection.

33. Flip-chip module according to claim 32, wherein the contact posts are arranged in a regular grid and the clearance between adjacent contact posts is less than or equal to 100 μm.

34. Flip-chip module according to claim 33, wherein the number of contact posts of the semiconductor chip is at least 50.

35. Flip-chip module according to claim 34, wherein the contact posts are each made of a metal post and a soldered section, with the metal post mounted directly on the semiconductor chip and the soldered section formed on the end of the metal post which is furthest away from the semiconductor chip.

36. Flip-chip module according to claim 35, wherein the metal post is made substantially of copper and/or gold.

37. Flip-chip module according to claim 16, wherein the flip-chip module comprises several semiconductor chips.

38. Flip-chip module according to claim 37, wherein the contact points each have a recess to accommodate the bottom end section of one of the contact posts.

39. Flip-chip module according to claim 38, characterized in that the recess extends into the substrate.

* * * * *